(12) United States Patent
Olsen

(10) Patent No.: US 7,122,454 B2
(45) Date of Patent: Oct. 17, 2006

(54) METHOD FOR IMPROVING NITROGEN PROFILE IN PLASMA NITRIDED GATE DIELECTRIC LAYERS

(75) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/461,143

(22) Filed: Jun. 12, 2003

(65) Prior Publication Data

US 2004/0038487 A1    Feb. 26, 2004

Related U.S. Application Data

(60) Provisional application No. 60/399,765, filed on Jul. 30, 2002, provisional application No. 60/388,599, filed on Jun. 12, 2002.

(51) Int. Cl.
*H01L 21/228* (2006.01)

(52) U.S. Cl. ................ 438/542; 438/513; 438/660; 438/775; 438/798; 438/913

(58) Field of Classification Search ................ 438/513, 438/542, 660, 775, 798, 913, FOR. 242, 438/FOR. 334, FOR. 401, FOR. 407
See application file for complete search history.

(56) References Cited

U.S. PATENT DOCUMENTS

| | | | | |
|---|---|---|---|---|
| 4,913,929 | A | * | 4/1990 | Moslehi et al. ............. 427/564 |
| 5,840,626 | A | * | 11/1998 | Ohguro ...................... 438/649 |
| 6,090,653 | A | * | 7/2000 | Wu ............................. 438/231 |
| 6,140,024 | A | * | 10/2000 | Misium et al. ............. 430/314 |
| 6,255,231 | B1 | * | 7/2001 | Chen et al. ................. 438/773 |
| 6,346,465 | B1 | * | 2/2002 | Miura et al. ................ 438/542 |
| 2002/0023900 | A1 | * | 2/2002 | Mahawili ............... 219/121.43 |
| 2004/0142577 | A1 | * | 7/2004 | Sugawara et al. .......... 438/772 |

* cited by examiner

*Primary Examiner*—George R. Fourson
*Assistant Examiner*—Joannie Adelle García
(74) *Attorney, Agent, or Firm*—Patterson & Sheridan, LLP

(57) ABSTRACT

A method is provided wherein a gate dielectric film that is plasma nitrided in a chamber of one system is subsequently heated or "annealed" in another chamber of the same system. Processing delay can be controlled so that all wafers processed in the system experience similar nitrogen content.

16 Claims, 14 Drawing Sheets

METHOD FOR IMPROVING NITROGEN PROFILE IN PLASMA NITRIDED GATE DIELECTRIC LAYERS

CROSS-REFERENCE TO RELATED APPLICATIONS

The present patent application claims priority from Provisional Patent Application No. 60/388,599, filed on Jun. 12, 2002, and Provisional Patent Application No. 60/399,765, filed on Jul. 30, 2002, both of which are incorporated herein by reference in their entirety.

BACKGROUND OF THE INVENTION

1). Field of the Invention

This invention relates to semiconductor processing, and more specifically to a method for improving nitrogen profile in plasma nitrided gate dielectric layers.

2). Discussion of Related Art

Gate dielectric films that are used for transistor fabrication are often nitrided with nitrogen ions to increase their capacitances. A small fraction of nitrogen in such a film is lost after being incorporated into the film before further processing. The total nitrogen content may differ from wafer to wafer because of differences in process delay, so that transistors of different wafers have dielectric layers with dramatically different capacitances.

SUMMARY OF THE INVENTION

A method is provided wherein a gate dielectric film that is nitrided in a chamber of one system is subsequently heated or "annealed" in another chamber of the same system. Processing delay can be controlled so that all wafers processed in the system experience similar depletion of nitrogen.

BRIEF DESCRIPTION OF THE DRAWINGS

The invention is further described by way of example with reference to the accompanying drawings, wherein.

DETAILED DESCRIPTION OF THE INVENTION

Figure 1:
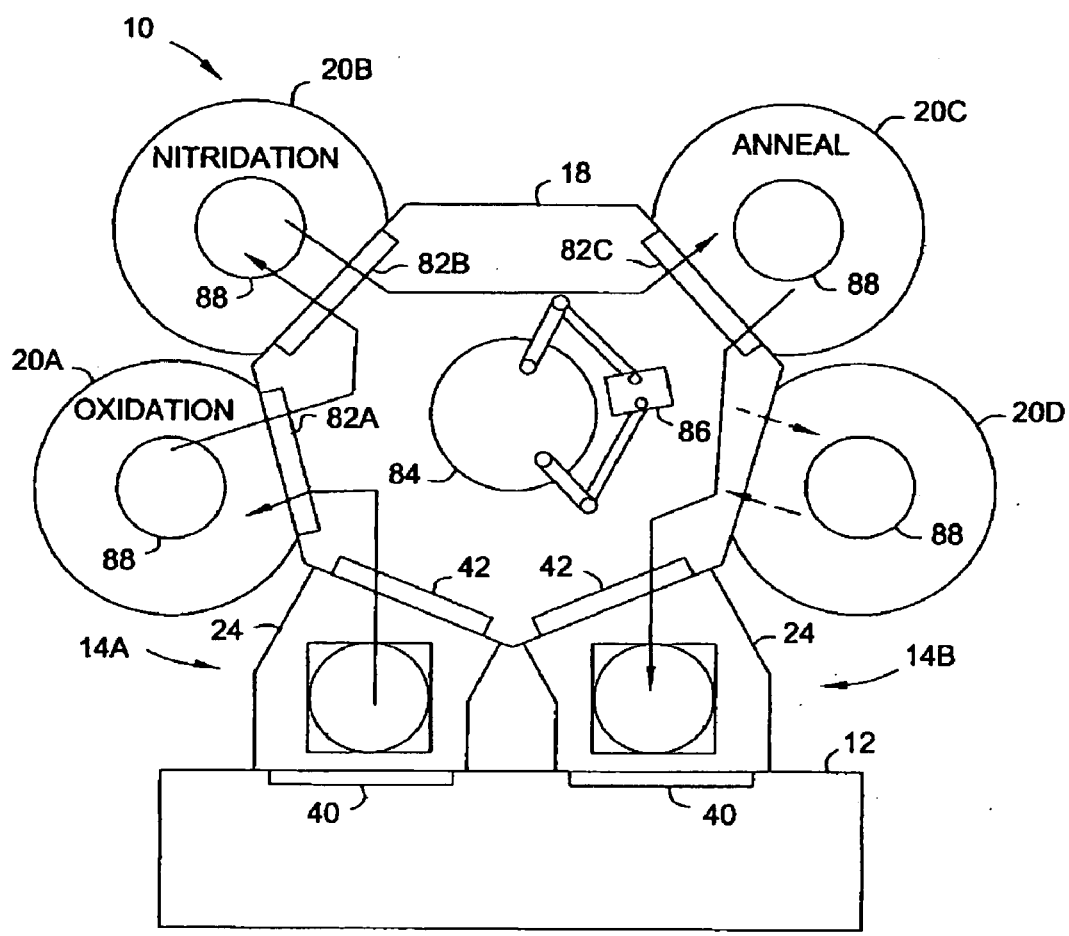
FIG. 1 is a plan view of a system for processing a substrate.

FIG. 1 of the accompanying drawings illustrates a system 10 for processing a semiconductor wafer. The system 10 includes a factory integration unit 12, first and second batch loadlock assemblies 14A and 14B, a transfer chamber 18, first, second, third, and fourth wafer processing chambers 20A, 2DB, 20C, and 20D.

Each wafer processing chamber 20A, 20B, 20C, and 20D leads directly off the transfer chamber 18. A respective slitvalve 82A, 82B, and 82C is mounted to open or close communication between the transfer chamber 18 and a respective one of the wafer processing chambers 20A, 20B, 20C, or 20D.

A robot 84 is located within the transfer chamber 18. The robot 84 has a blade 86 which, when the robot is operated, can transfer a wafer from one of the chambers 20A, 20B, 20C, 20D to another. A susceptor 88 is located in each one of the chambers 20, on which the wafer can be located by the blade 86.

Figure 2:
FIG. 2 is a cross-sectional side view illustrating a wafer substrate before being inserted into the system of FIG. 1.

FIG. 2 illustrates a substrate 60 before being inserted into the system 10. The substrate 60 is made of silicon having an upper layer of epitaxial silicon which has been cleaned so that it is exposed.

A controller (not shown) is used for controlling various components of the system 10 shown in FIG. 1.

The controller is typically a computer having a processor which is programmed to execute a program which controls all the components of the system 10. The program includes processor-executable code and is typically stored on a disk or other computer-readable medium and then loaded into memory of the computer from where the processor of the computer reads and executes the program to control the components of the system 10. Particular features of the program and how it is constructed will be evident to one skilled in the art from the discussion that follows.

Figure 3:
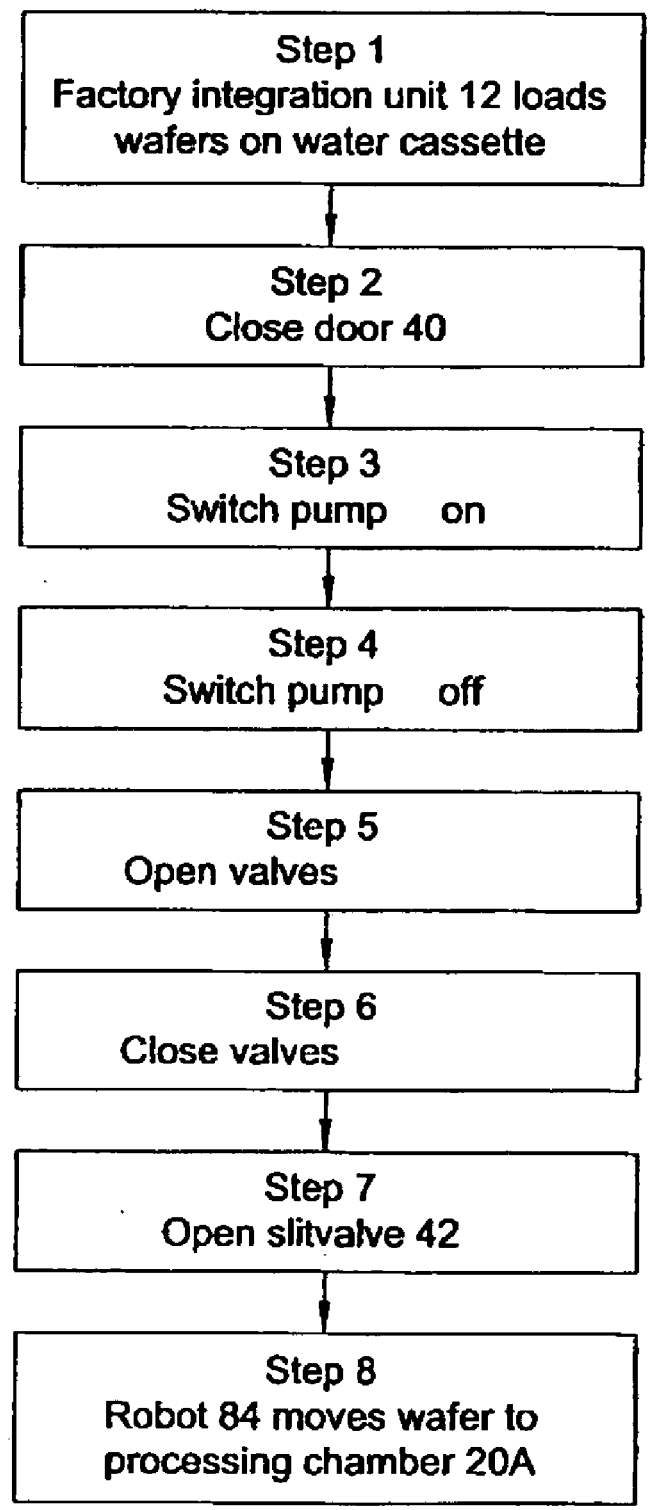
FIG. 3 is a flow chart illustrating how the system is operated to insert the substrate into one of its chambers.

FIG. 3 is a flow chart which assists in illustrating how the system 10 is operated.

Slitvalves 42 are initially closed so that the confines of the transfer chamber 18 are not in communication with the loadlock chambers 24. The loadlock chamber 24 is initially evacuated to remove contamination. The loadlock chamber 24 is then backfilled with an inert gas such as nitrogen. The slitvalves 82A, 82B, 82C are open so that the wafer processing chambers 20A, 20B, 20C, 20D are in communication with the transfer chamber 18. The transfer 18 and the wafer processing chambers 20A, 20B, 20C, 20D are filled with an inert gas such as nitrogen gas. A door 40 of the first loadlock assembly 14A is opened.

A robot (not shown) located within the factory integration unit 12 then loads a total of twenty-five wafer substrates on the wafer cassette in the first loadlock assembly 14A (Step 1). The A door 40 is then closed so that the substrates are isolated within the loadlock chamber 24 (Step 2).

The slitvalve 42 is then opened (Step 7). The robot 84 then removes one substrate from a wafer cassette in the loadlock chamber 24 and locates the substrate within the first wafer processing chamber 20A (step 8). The slitvalve 82 is then closed so that the wafer processing chamber 20 is isolated from the transfer chamber 18 (Not shown).

Figure 4:
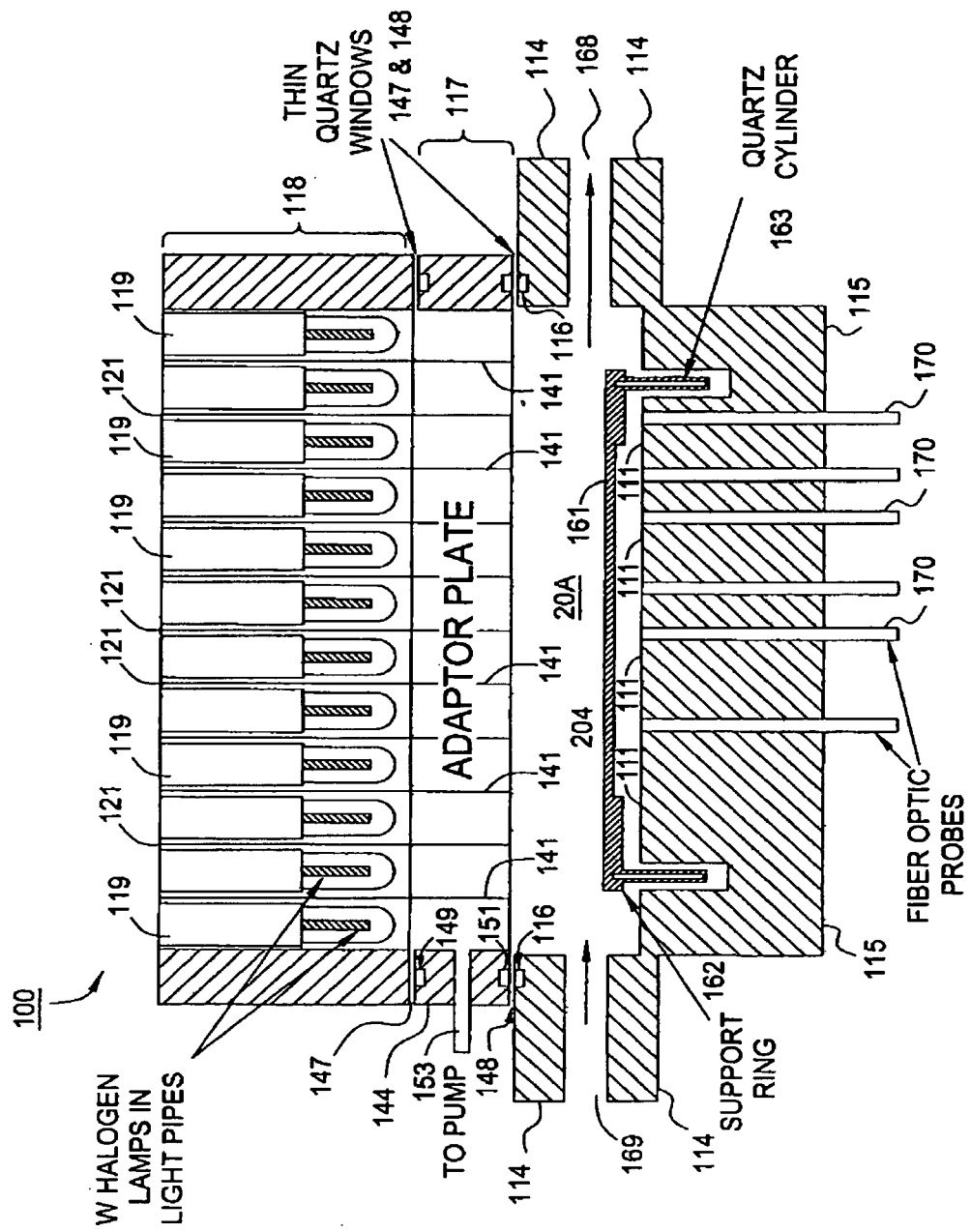
FIG. 4 is a cross-sectional side view of a rapid thermal heating apparatus having a chamber into which the substrate is inserted.
Figure 5:
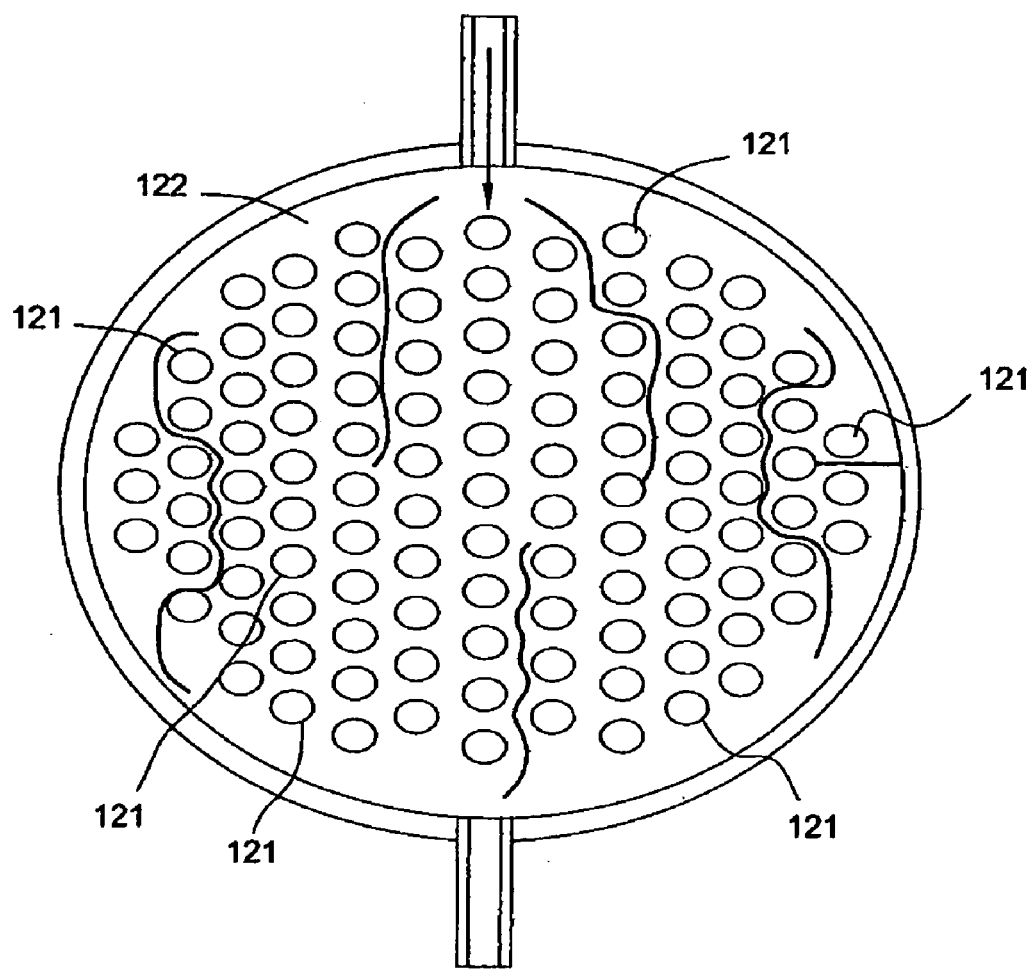
FIG. 5 is a bottom view of a lid of the apparatus of FIG. 4.

As illustrated in FIGS. 4 and 5, the wafer processing chamber 20A is a cold wall chamber and forms part of a rapid thermal heating apparatus 100. The rapid thermal heating apparatus 100, as shown in FIG. 1, includes the evacuated processing chamber 20A enclosed by a sidewall 114 and a bottom wall 115. Sidewall 114 and bottom wall 115 are preferably made of stainless steel. The upper portion of sidewall 114 of chamber 20A is sealed to a window assembly 117 by "O" rings 116. A radiant energy light pipe assembly 118 is positioned over and coupled to window assembly 117. The radiant energy assembly 118 includes a plurality of tungsten halogen lamps 119, for example Sylvania EYT lamps, each mounted into a light pipe 121 which can be stainless steel, brass, aluminum or other metal.

The substrate 60 is supported on its edge inside chamber 20A by a support ring 162 made up of silicon carbide. Support ring 162 is mounted on a rotatable quartz cylinder 163. By rotating quartz cylinder 163 support ring 162 and substrate 60 can be caused to rotate. An additional silicon carbide adapter ring can be used to allow wafers of different diameters to be processed (e.g., 150 mm as well as 200 mm). The outside edge of support ring 162 preferably extends less than two inches from the outside diameter of substrate 60. The volume of chamber 20A is approximately two liters.

The bottom wall 115 of apparatus 100 includes a gold-coated top surface 111 for reflecting energy onto the backside of substrate 60. Additionally, rapid thermal heating apparatus 100 includes a plurality of fiber optic probes 170 positioned through the bottom wall 115 of apparatus 100 in order to detect the temperature of substrate 60 at a plurality of locations across its bottom surface. Reflections between the backside of the substrate 60 and reflecting surface 111 create a blackbody cavity which makes temperature measurement independent of wafer backside emissivity, and thereby provides accurate temperature measurement capability.

The rapid thermal heating apparatus 100 includes a gas inlet 169 formed through sidewall 114 for injecting process gas into chamber 20A to allow various processing steps to be carried out in chamber 20A. Coupled to gas inlet 169 is a source, such as a tank, of oxygen-containing gas such as $O_2$ and a source, such as a tank, of hydrogen-containing gas such as $H_2$. Positioned on the opposite side of gas inlet 169, in sidewall 114, is a gas outlet 168. Gas outlet 168 is coupled to a vacuum source, such as a pump, to exhaust process gas from chamber 20A and to reduce the pressure in chamber 20A. The vacuum source maintains a desired pressure while process gas is continually fed into the chamber during processing.

Lamps 119 include a filament wound as a coil with its axis parallel to that of the lamp envelope. Most of the light is emitted perpendicular to the axis toward the wall of the surrounding light pipe. The light pipe length is selected to at least be as long as the associated lamp. It may be longer, provided that the power reaching the wafer is not substantially attenuated by increased reflection. Light assembly 118 preferably includes 187 lamps positioned in a hexagonal array or in a "honeycomb shape" as illustrated in FIG. 5. Lamps 119 are positioned to adequately cover the entire surface area of substrate 60 and support ring 162. Lamps 119 are grouped in zones which can be independently controlled to provide for extremely uniform heating of substrate 60. Light pipes 121 can be cooled by flowing a coolant, such as water, between the various heat pipes. The radiant energy source 118, comprising the plurality of light pipes 121 and associated lamps 119, allows the use of thin quartz windows to provide an optical port for heating a substrate within the evacuative process chamber.

Window assembly 117 includes a plurality of short light pipes 141 which are brazed to upper/lower flange plates which have their outer edges sealed to a side wall 144. A coolant, such as water, can be injected into the space between light pipes 141 to serve to cool light pipes 141 and flanges. Light pipes 141 register with light pipes 121 of the illuminator. The water-cooled flange with the light pipe pattern which registers with the lamp housing is sandwiched between two quartz windows 147 and 148. These plates are sealed to the flange with "O"rings 149 and 151 near the periphery of the flange. The upper and lower flange plates include grooves which provide communication between the light pipes. A vacuum can be produced in the plurality of light pipes 141 by pumping through a tube 153 connected to one of the light pipes 141, which in turn is connected to the rest of the flange. Thus, when the sandwiched structure is placed on a processing chamber 20A, the metal flange, which is typically stainless steel and which has excellent mechanical strength, provides adequate structural support. The lower quartz window 148, the one actually sealing the processing chamber 20A, experiences little or no pressure differential because of the vacuum on each side, and thus can be made very thin. The adapter plate concept of window assembly 117 allows quartz windows to be easily changed for cleaning or analysis. In addition, the vacuum between the quartz windows 147 and 148 of the window assembly 117 provides an extra level of protection against toxic gases escaping from the reaction chamber.

The rapid thermal heating apparatus 100 is a single wafer reaction chamber capable of ramping the temperature of a substrate 60 at a rate of 25–100° C./sec. Rapid thermal heating apparatus 100 is said to be a "cold wall" reaction chamber because the temperature of the wafer during the oxidation process is at least 400° C. greater than the temperature of chamber sidewalls 114. Heating/cooling fluid can be circulated through sidewalls 114 and/or bottom wall 115 to maintain walls at a desired temperature. For a steam oxidation process utilizing the insitu moisture generation of the present invention, chamber walls 114 and 115 are maintained at a temperature greater than room temperature (23° C.) in order to prevent condensation. Rapid thermal heating apparatus 100 is preferably configured as part of a "cluster tool" which includes a load lock and a transfer chamber with a robotic arm.

Figure 6:
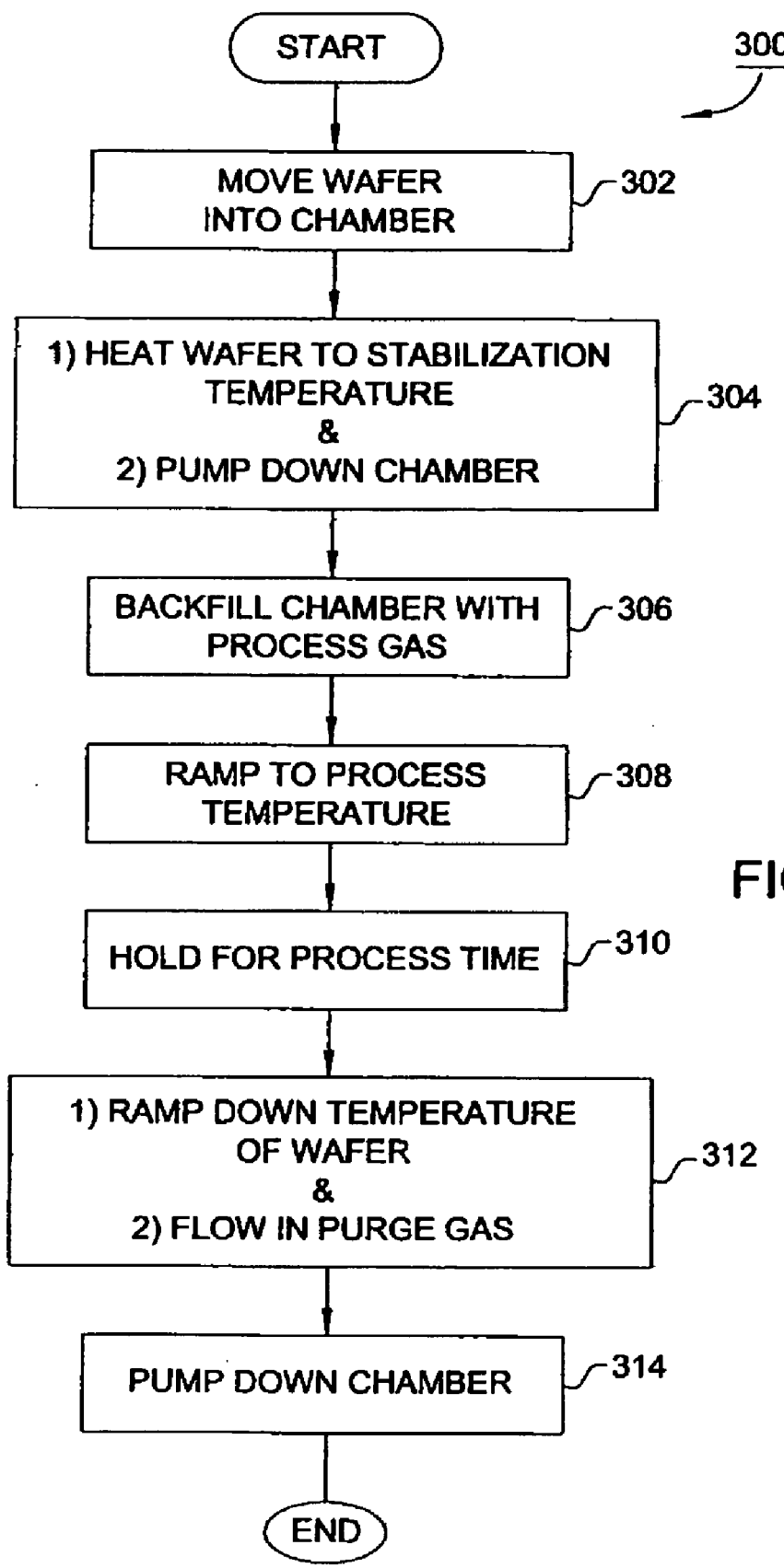
FIG. 6 is a flow chart illustrating how the substrate is processed in the apparatus of FIG. 4.

A method of insitu generation of moisture or steam in a rapid thermal oxidation process according to the present invention is illustrated in flow chart 300 of FIG. 6. The method of the present invention will be described with respect to an insitu moisture-generation process in the rapid thermal heating apparatus illustrated in FIGS. 4 and 5. It is to be appreciated that the insitu moisture-generation oxidation process of the present invention can be used to oxidize any form of silicon, including epitaxial, amorphous, or polycrystalline, including doped and undoped forms. Additionally, the process can be used to passivate or oxidize other device or circuit features including, but not limited to, emitter and capacitor electrodes, interconnects, and trenches, as well as be used to form gate dielectric layers.

The first step according to the present invention, as set forth in block 302, is to move a wafer or substrate, such as substrate 60, into vacuum chamber 20A. As is typical with modem cluster tools, substrate 60 will be transferred by a robot arm from a load lock through a transfer chamber and placed face up onto silicon carbide support ring 162 located in chamber 20A as shown in FIG. 1. Substrate 60 will generally be transferred into vacuum chamber 20A, having a nitrogen ($N_2$) ambient at a transfer pressure of approximately 20 Torr. Chamber 20A is then sealed.

Next, as set forth in block 304, the pressure in chamber 20A is further reduced by evacuating the nitrogen ($N_2$) ambient through gas outlet 168. Chamber 20A is evacuated to a pressure to sufficiently remove the nitrogen ambient. Chamber 20A is pumped down to a prereaction pressure less than the pressure at which the insitu moisture generation is to occur, and is preferably pumped down to a pressure of less than 1 Torr.

Simultaneously with the prereaction pump-down, power is applied to lamps 119 which in turn irradiate substrate 60 and silicon carbide support ring 162, and thereby heat substrate 60 and support ring 162 to a stabilization temperature. The stabilization temperature of substrate 60 is less than the temperature (reaction temperature) required to initiate the reaction of the hydrogen-containing gas and oxygen-containing gas to be utilized for the insitu moisture generation. The stabilization temperature in the preferred embodiment of the present invention is approximately 500° C.

Once the stabilization temperature and the prereaction pressure are reached, chamber 20A is backfilled with the desired mixture of process gas, as shown in block 306. The process gas includes a reactant gas mixture comprising two reactant gases: a hydrogen-containing gas and an oxygen-containing gas, which can be reacted together to form water vapor ($H_2O$) at temperatures between 400–1250° C. The hydrogen-containing gas is preferably hydrogen gas ($H_2$), but may be other hydrogen-containing gases such as, but not limited to, ammonia ($NH_3$), deuterium (heavy hydrogen), and hydrocarbons such as methane ($CH_4$). The oxygen-containing gas is preferably oxygen gas ($O_2$), but may be other types of oxygen-containing gases such as, but not limited to, nitrous oxide ($N_2O$). Other gases, such as, but not limited to, nitrogen ($N_2$), may be included in the process gas mix if desired. The oxygen-containing gas and the hydrogen-containing gas are preferably mixed together in chamber 20A to form the reactant gas mixture.

Next, as set forth in block 308, power to lamps 119 is increased so as to ramp up the temperature of the substrate 60 to process temperature. Substrate 60 is preferably ramped from the stabilization temperature to process temperature at a rate of between 10–100° C./sec. with at least 50° C./sec. being preferred. The preferred process temperature of the present invention is between 600–1150° C. with 950° C. being preferred. The process temperature must be at least the temperature at which the reaction between the oxygen-containing gas and the hydrogen-containing gas can be initiated by substrate 60, which is typically at least 600° C. It is to be noted that the actual reaction temperature depends upon the partial pressure of the reactant gas mixture as well as on the concentration ratio of the reactant gas mixture, and can be between 400° C. and 1250° C.

As the temperature of substrate 60 is ramped up to process temperature, it passes through the reaction temperature and causes the reaction of the hydrogen-containing gas and the oxygen-containing gas to form moisture or steam ($H_2O$). Since rapid thermal heating apparatus 100 is a "cold wall" reactor, the only sufficiently hot surfaces in chamber 20A to initiate the reaction are the substrate 60 and support ring 162. As such, in the present invention the moisture-generating reaction occurs near, about 1 cm from, the surface of substrate 60. In the present invention, the moisture-generating reaction is confined to within about two inches of the substrate 60, or about the amount at which support ring 162 extends past the outside edge of substrate 60. Since it is the temperature of the wafer (and support ring) which initiates or turns "on" the moisture-generation reaction, the reaction is said to be thermally controlled by the temperature of substrate 60 (and support ring 162). Additionally, the vapor-generation reaction of the present invention is said to be "surface catalyzed" because the heated surface of the wafer is necessary for the reaction to occur; however, it is not consumed in the reaction which forms the water vapor.

Next, as set forth in block 310, once the desired process temperature has been reached, the temperature of substrate 60 is held constant for a sufficient period of time to enable the water vapor generated from the reaction of the hydrogen-containing gas and the oxygen-containing gas to oxidize silicon or films to form $SiO_2$. Substrate 60 will typically be held at process temperature for between 30–120 seconds. Process time and temperature are generally dictated by the thickness of the oxide film desired, the purpose of the oxidation, and the type and concentrations of the process gases.

Next, as set forth in block 312, power to lamps 119 is reduced or turned off to reduce the temperature of substrate 60. The temperature of substrate 60 decreases (ramps down) as fast as it is able to cool down (at about 50° C./sec.). Simultaneously, $N_2$ purge gas is fed into the chamber 20A. The moisture-generation reaction ceases when substrate 60 and support ring 162 drop below the reaction temperature. Again it is the substrate temperature (and support ring) which dictates when the moisture reaction is turned "on" or "off."

Next, as set forth in block 314, chamber 20A is pumped down, preferably below 1 Torr, to ensure that no residual oxygen-containing gas and hydrogen-containing gas are present in chamber 20A. The chamber is then backfilled with $N_2$ gas to the desired transfer pressure of approximately 20 Torr, and substrate 60 is transferred out of chamber 20A to complete the process. At this time a new wafer may be transferred into chamber 20A and the process set forth in flow chart 300, repeated.

Figure 7:
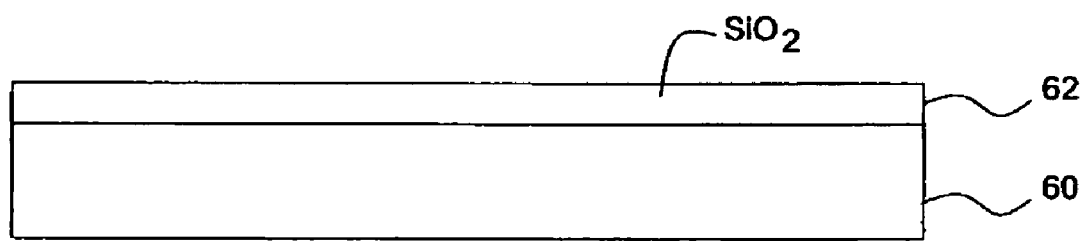
FIG. 7 is a cross-sectional side view similar to FIG. 2 after the wafer substrate is processed in the apparatus of FIG. 4.

Referring again to FIG. 1, the substrate 60 is then located within the transfer chamber 18. FIG. 7 illustrates the substrate 60 after being moved into the transfer chamber 18. A thin silicon dioxide layer 62 is formed on the wafer substrate 60.

The blade 86 transfers the substrate 60 immediately from the processing chamber 20A through the transfer chamber 18 into the processing chamber 20B. The transfer time is typically less than 30 seconds, but ideally is less than 10 minutes, more preferably less than two minutes.

Figure 8:
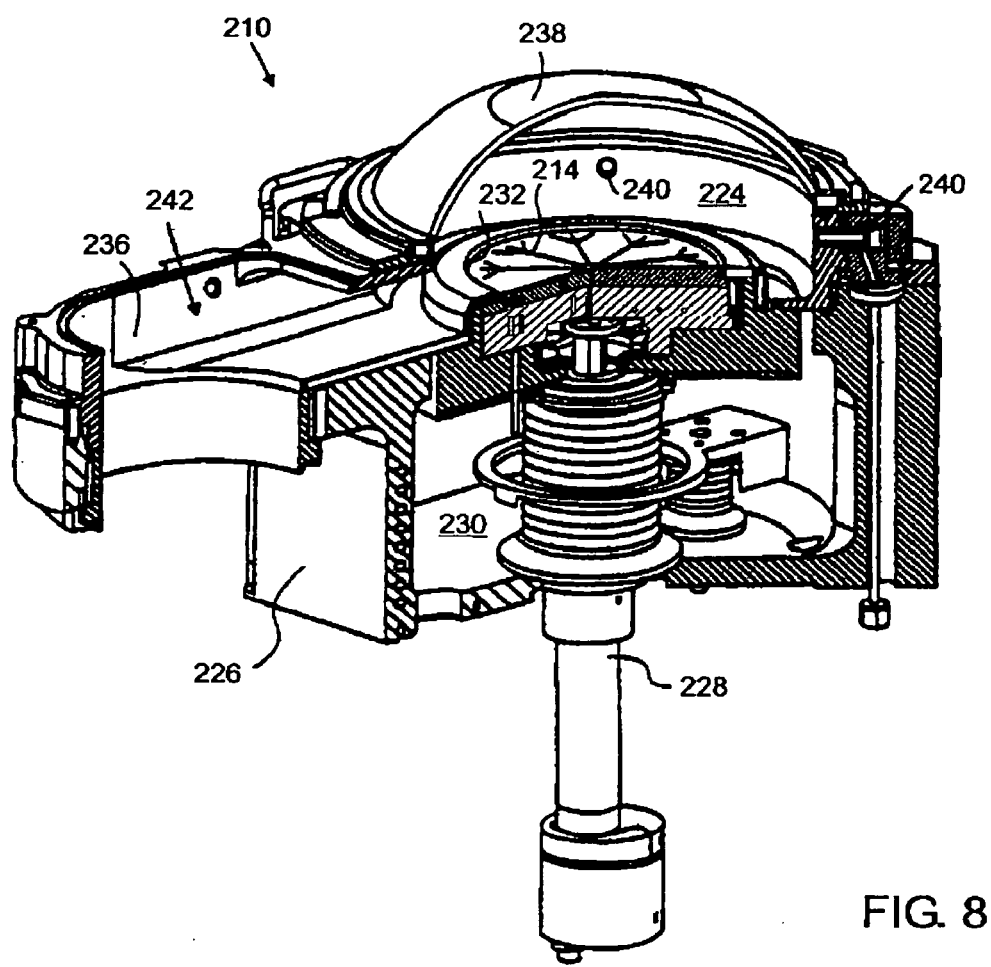
FIG. 8 is a perspective view of a plasma reactor having another chamber into which the substrate is inserted.
Figure 9:
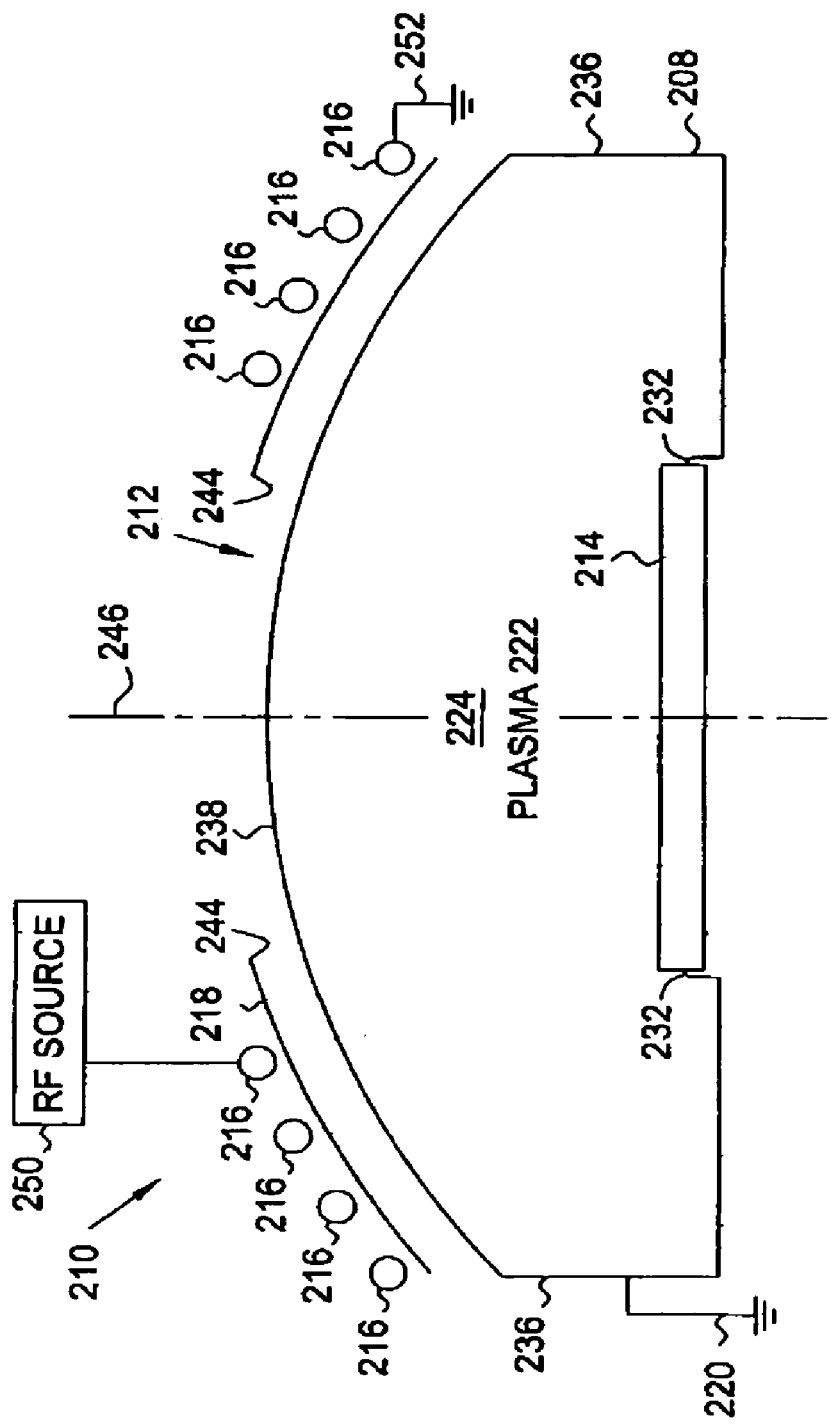
FIG. 9 is a cross-sectional side view illustrating a chamber of the system of FIG. 8.

As illustrated in FIGS. 8 and 9, the nitridation processing chamber 20B forms part of a plasma reactor 210. The plasma reactor 210 includes the chamber 20B, a substrate holder 214, an RF coil 216, and an electrode plate 218.

Referring specifically to FIG. 8, the plasma reactor 210 further includes a lower transfer chamber 226 and a transfer mechanism 228. The chamber 20B is positioned on top of the transfer chamber 226. An internal volume 230 of the transfer chamber 226 is placed in communication with an internal volume 224 of the chamber 20B through a circular opening 232 in a base of the chamber 20B. The substrate holder 214 is secured on top of the transfer mechanism 228, and the transfer mechanism 228 can be used to elevate or lower the substrate holder 214.

In use, the transfer mechanism 228 is operated so that the substrate holder 214 is lowered into the internal volume 230 of the transfer chamber 226. A wafer substrate 60, positioned on a blade attached to a robot arm, is then transferred through a slit-valve opening in a wall of the transfer chamber 226 into the internal volume 230. The transfer mechanism 228 is then operated to elevate the substrate holder 214 so that the substrate holder 214 contacts a lower surface of the wafer substrate and elevates the wafer substrate off the blade. The blade is then removed from the transfer chamber 226, whereafter the transfer mechanism 228 is again operated to elevate the substrate holder 214 into the opening 232. The wafer substrate, located on the substrate holder 214, then has an upper surface which is exposed to the internal volume 224 of the chamber 20B.

The chamber 20B includes primarily a conductive body 236 and a dielectric quartz upper wall 238. The conductive body 236 forms a lower portion of the chamber 20B, and the upper wall 238 forms an upper portion of the chamber 20B. The conductive body 236 and the upper wall 238 jointly define the internal volume 224.

Four gas nozzle ports 240 are formed through the conductive body 236 into the internal volume 224. The gas nozzle ports 240 are positioned at 90° intervals around the substrate holder 214. The conductive body 236 also defines a vacuum pumping channel 242 on one side thereof. The gas nozzle ports 240 are connected through valves to a gas manifold, and the vacuum pumping channel 242 is connected to a pump. When the pump is operated, gases are extracted from the internal volume 224 through the vacuum pumping channel 242 to reduce a pressure within the internal volume 224. The valves can be operated to allow gases from the manifold through the valves and the gas nozzle ports 240 into the internal volume 224.

Referring more specifically to FIG. 9, the upper wall 238 has a dome shape, and the electrode plate 218 has a dome shape that conforms to an outer surface of the upper wall 238. The electrode plate 218 is in fact located directly on the upper wall 238. The electrode plate 218 defines a circular opening 244 over a center of the upper wall 238. The upper wall 238 and the electrode plate 218 are symmetrical around a vertical axis 246.

The coil 216 spirals around the vertical axis 246 and the opening 244. The coil 216 is positioned on and conforms to the dome shape of the electrode plate 218. One end of the coil 216 is connected to an RF source 250, and an opposing end of the coil 216 is connected to ground 252.

Figure 10:
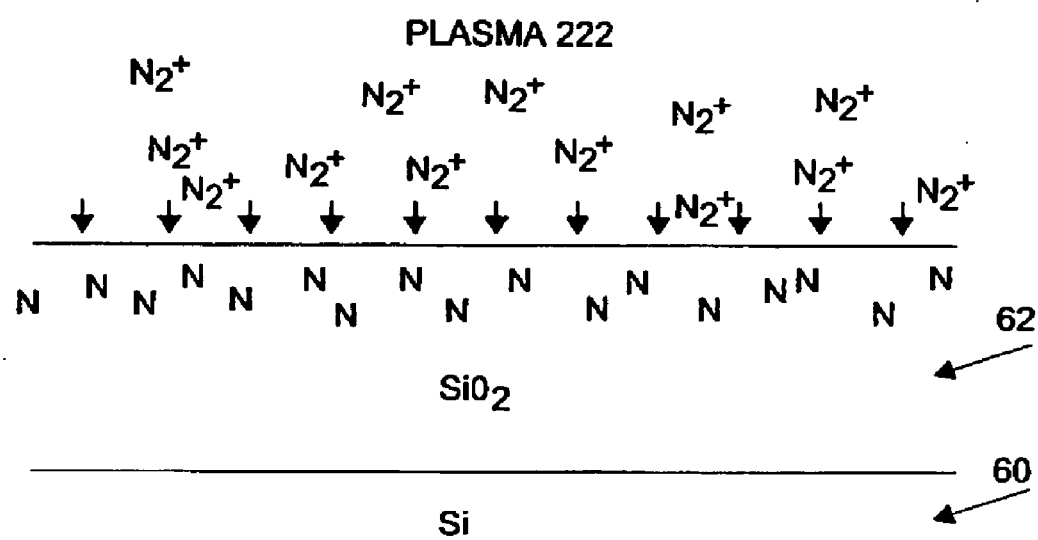
FIG. 10 illustrates how the system of FIGS. 8 and 9 can be used to incorporate nitrogen into a silicon dioxide gate dielectric layer.

Reference is now made to FIGS. 9 and 10 in combination. The purpose of inserting the wafer substrate into the plasma reactor 210 is to incorporate nitrogen (N) into the silicon dioxide layer 62 for purposes of modifying or improving its dielectric properties. A plasma 222 of nitrogen ions ($N_2^+$) is created within the internal volume 224. The nitrogen ions have energies defined by the properties of the plasma which leads to their being incorporated into the silicon dioxide layer 62.

The plasma is created by first reducing the pressure within the internal volume 224 to a predetermined level. A nitrogen-containing gas is then introduced into the internal volume 224. The nitrogen-containing gas may, for example, be pure nitrogen ($N_2$), a mixture of nitrogen and helium gases ($N_2$/He), a mixture of nitrogen and neon gases ($N_2$/Ne), or a mixture of nitrogen and argon gases ($N_2$/Ar). For purposes of further discussion, examples are given where the gas is pure nitrogen gas.

The RF source 250 is then operated to provide RF current to the coil 216 at a frequency of 12.56 MHz. The RF coil 216 generates an RF field which is spread by the electrode plate 218 across the upper wall 238. The circular opening 244 permits the RF field to enter through the upper wall 238 into the internal volume 224. The RF field then couples with the nitrogen gas in the internal volume 224. The RF field initially excites a small number of free electrons. The free electrons then collide with other atoms to release more electrons from these atoms. The process is continued until a steady-state condition is achieved, where the plasma 222 has a steady amount of free electrons and free ions, a steady electron temperature, and a constant voltage relative to ground. A "reservoir" of ions is so created within the internal volume 224, and the voltage potential of the plasma 222 assists in incorporating ions from this reservoir into the silicon dioxide layer 62. The potential of the substrate and the substrate holder 214 floats freely during the entire process, but there is a difference in the voltage of the plasma 222 and that of the substrate holder 214, the difference driving the incorporation of the ions. The substrate is held at a temperature of between 25 and 30° C., and the pressure in the chamber 20B is around 10 mTorr.

Referring again to FIG. 1, the substrate 60 is then moved on the plate 86 from the processing chamber 20B through the transfer chamber 18 and then immediately into the anneal processing chamber 20C. The transfer from the processing chamber 20B to the processing chamber 20C is typically less than 30 seconds, but is preferably less than 10 minutes and more preferably less than two minutes.

Figure 11:
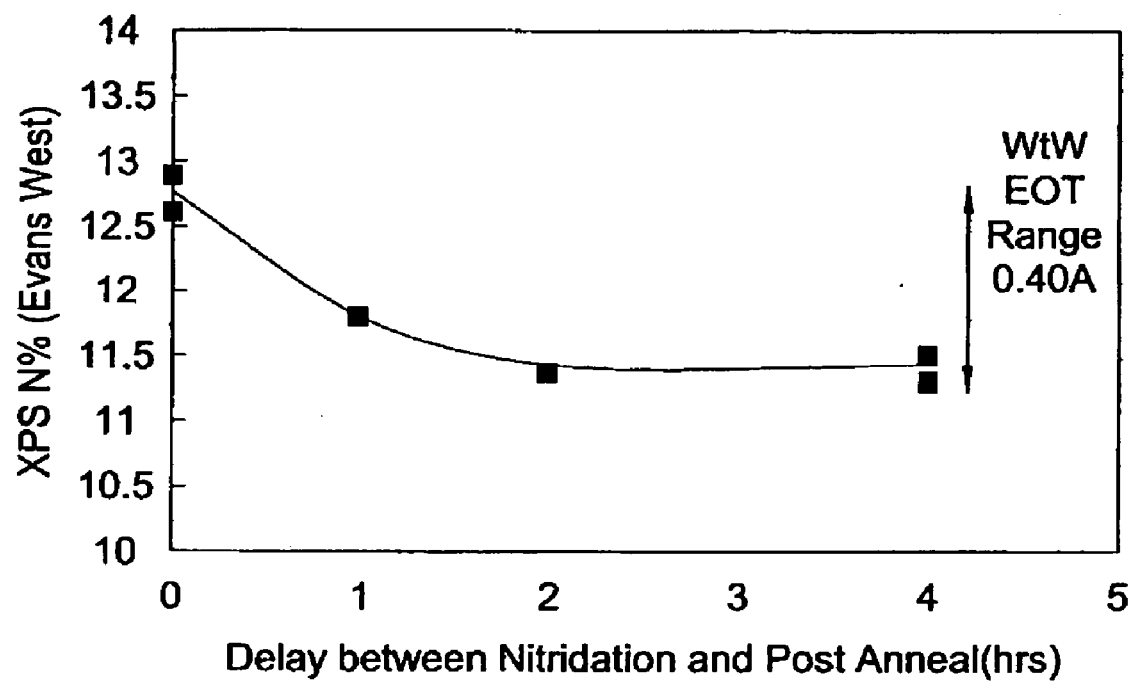
FIG. 11 is a graph illustrating nitrogen levels after different time periods.

FIG. 11 illustrates nitride remaining after different periods of time. X-ray photo electron spectroscopy (XPS) measurement results of nitrogen percentage is indicated against delay between nitridation and post-anneal. Depletion of nitrogen in the silicon dioxide layer can be minimized by immediately processing the substrate 60 in the chamber 20C after being processed in the chamber 20B. Furthermore, by controlling the processing within one system 10, the time difference between processing in the chamber 20B and the chamber 20C can be controlled. Should the substrate, for example, first be transferred to an external environment (e.g., in air) and then be processed in another system, the time difference in processing cannot be controlled. Moreover, different substrates may be processed differently, so that one substrate may, for example, have a delay of a few minutes, and another substrate may, for example, have a delay of a few hours in processing. Such differences in delay will cause differences in nitrogen depletion and differences in the capacitances of the dielectric layers on the different substrates.

The processing chamber 20C may form part of an apparatus that is exactly the same as the apparatus illustrated in FIG. 4. Hydrogen gas is introduced into the processing chamber 20C. In another embodiment, nitrogen or another gas may be used. The heat within the processing chamber 20C "anneals" the dielectric layer. The optimum temperature may be between 700° C. to 1100° C. In the present example, the temperature is approximately 1000° C., at a pressure of between 0.5 to 5 Torr. The substrate is annealed for approximately 15 seconds. The effect of annealing of the dielectric layer is that nitrogen depletion is substantially reduced. As an alternative, the substrate may be transferred from the processing chamber 20B directly back to the processing chamber 20A, where the dielectric layer may be annealed. Further processing, such as the formation of a polysilicon gate dielectric layer, may be carried out within another chamber within the system, for example, the chamber 20D, or the substrate 60 may be transferred out of the system. Because the time between processes is controlled and repeatable, different wafers will have dielectric layers having similar capacitances. The substrate is removed following a sequence which is a reverse of the sequence shown in FIG. 3.

It is believed that nitrogen in a top portion of the $SiO_xN_y$ film leaves the film first due to a chemical non-equilibrium that exists between the nitrogen in the film and a gas above the film. The nitrogen that is the farthest from the channel of the final transistor, i.e. at the top surface, is also the most important to keep. Retaining top-surface nitrogen improves the nitrogen profile and potentially the dielectric performance. Depletion of the nitrogen in the top of the film can be reduced in a process that reduces the total amount of nitrogen lost.

Figure 12:
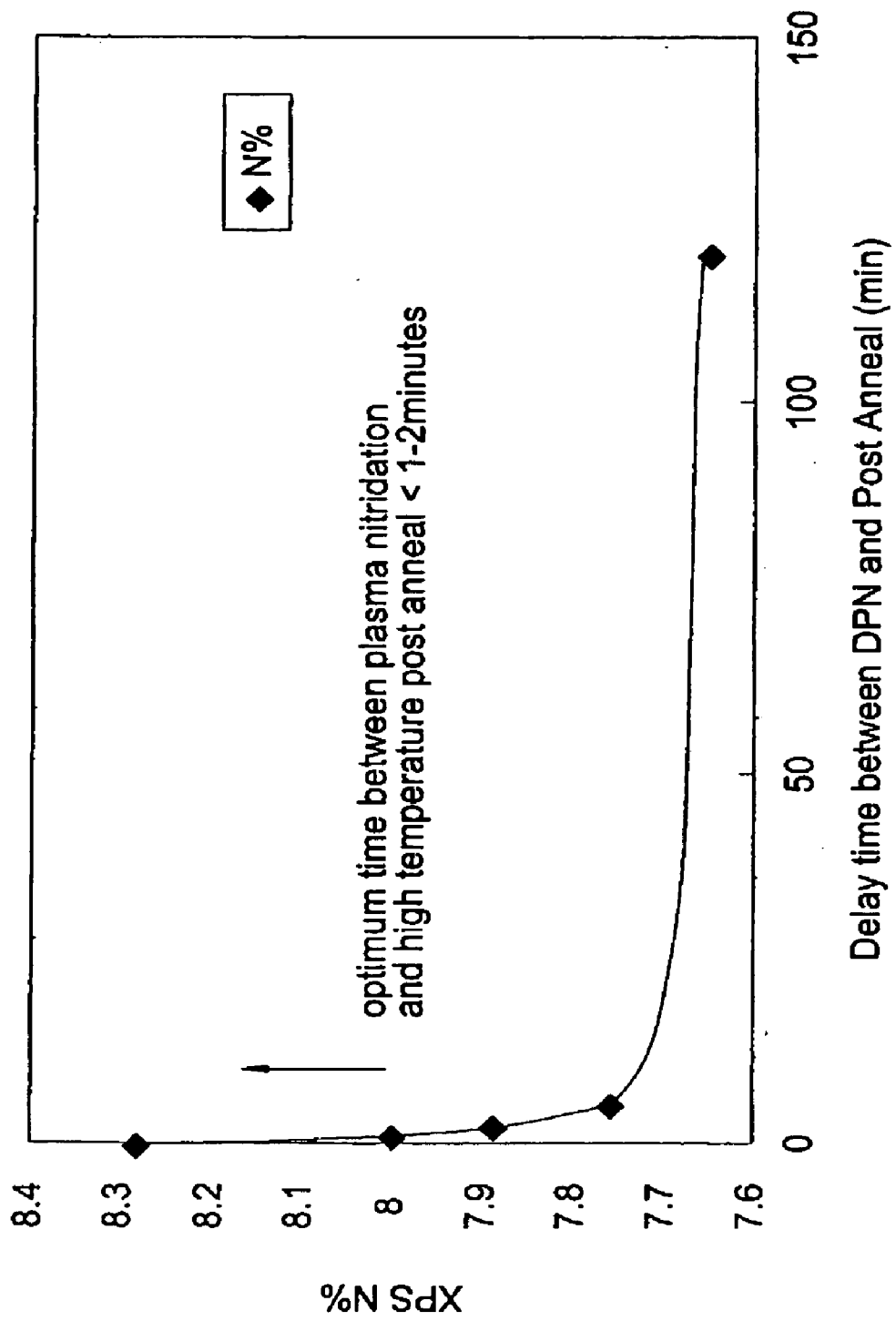
FIG. 12 is a graph illustrating nitrogen levels after different time periods over a smaller time period than in FIG. 11.

FIG. 12, for example, illustrates that the most nitrogen is lost during the first five minutes after plasma nitridation. An anneal step within the first two minutes, preferably within the first minute after plasma nitridation, can greatly reduce overall nitrogen loss, and especially nitrogen loss in the top of the film.

Figure 13:
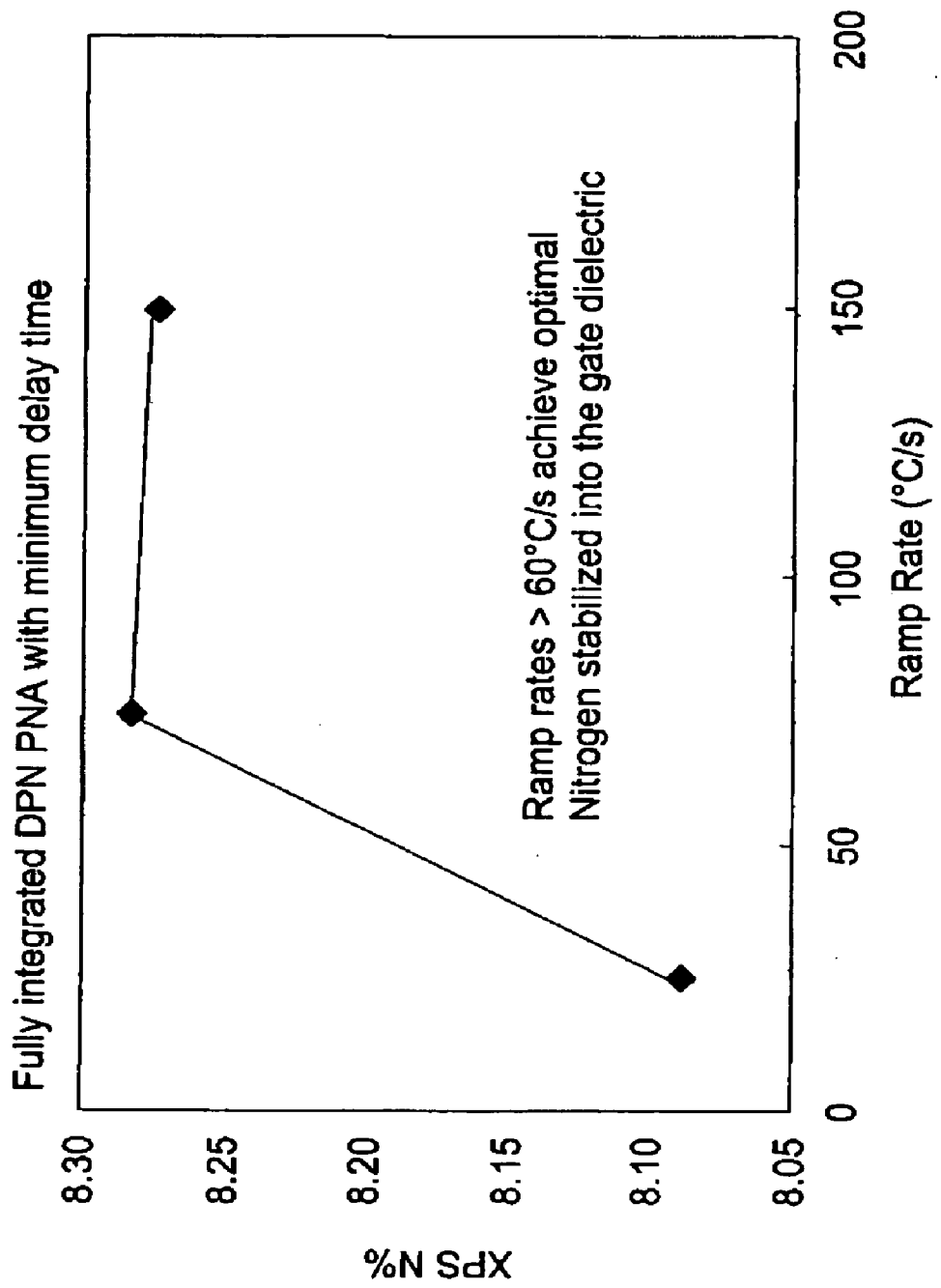
FIG. 13 is a graph illustrating nitrogen percentage when using different temperature ramp rates in an anneal step.

Temperature ramp rate can also affect nitrogen loss, as illustrated in FIG. 13. The temperature ramp rate is preferably higher than 60° C./s to minimize the time to achieve a temperature greater than 800° C., and thereby minimize any potential nitrogen loss.

Figure 14:
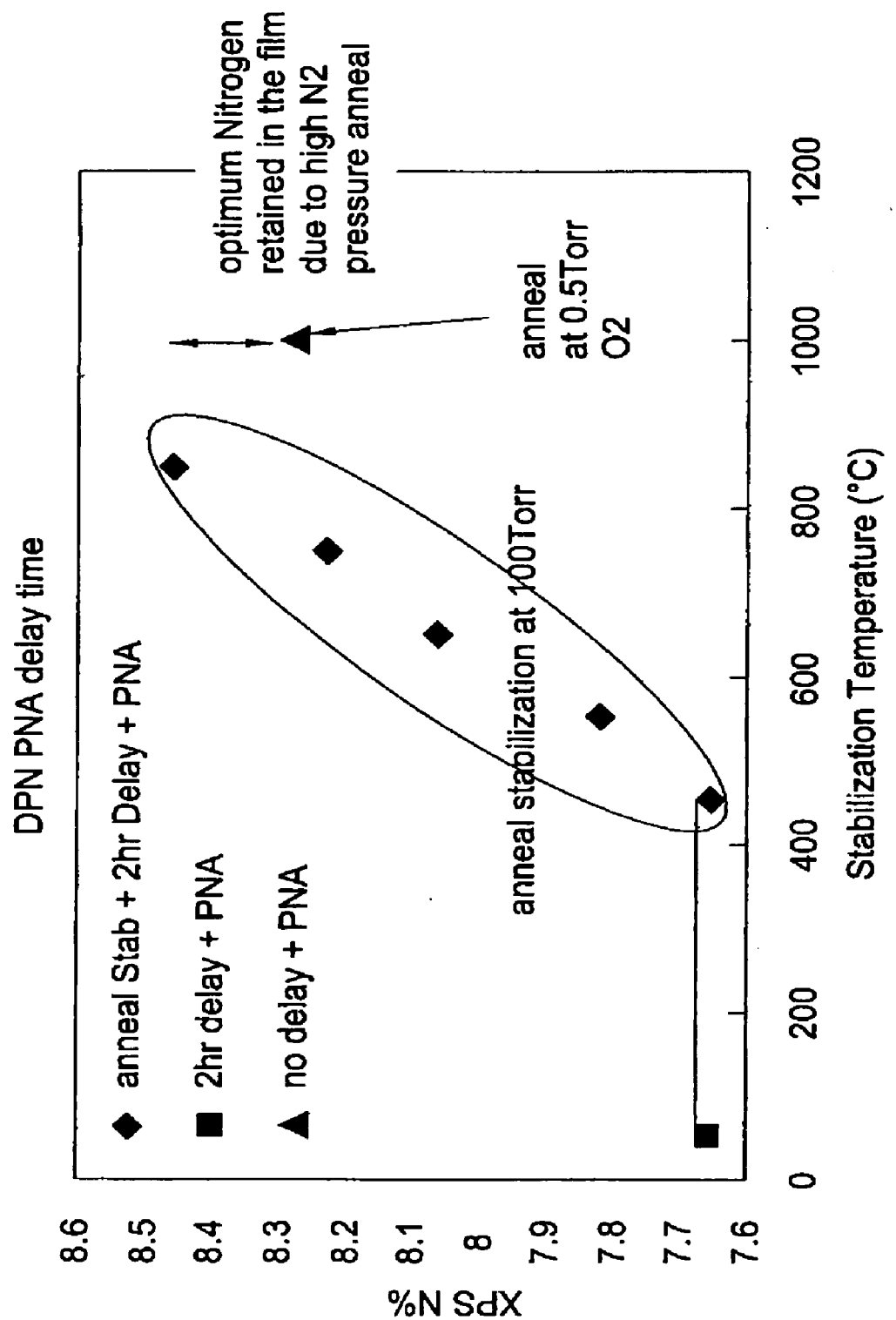
FIG. 14 is a graph illustrating nitrogen retention when similar films are annealed respectively in low-pressure oxygen and high-pressure nitrogen environments.

As illustrated in FIG. 14, the pressure and environment in which the anneal step is carried out can also dramatically influence the amount of nitrogen retention in the film. An anneal carried out in an oxygen environment of 0.5 Torr results in a nitrogen retention of 8.3%, whereas an anneal at a temperature of only 800° C. in a nitrogen ambient of 100 Torr leads to nitrogen retention in the film of approximately 8.45%. It is believed that both the nitrogen ambient and the higher pressure lead to a lower chemical imbalance between the nitrogen in the film and the gas above the film, with a correspondingly lower rate of nitrogen loss from the film. An extrapolation of nitrogen retention at different temperatures in a nitrogen environment of 100 Torr suggests that an anneal step carried out in a nitrogen environment of 100 Torr at a temperature of 1000° C. may lead to a nitrogen retention of approximately 8.6%. In another embodiment, the pressure may be at least 50 Torr. In another embodiment, the chamber 20C may have at least 50% nitrogen by volume.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of processing a substrate, comprising:
   incorporating nitrogen (N) into a gate dielectric layer formed on the substrate while the substrate is located in a nitridation chamber of a system;
   transporting the substrate to an anneal chamber of the system without transporting the substrate out of the system; and
   annealing the gate dielectric layer by heating the substrate while in the anneal chamber to a temperature above a temperature of the substrate in the nitridation chamber.

2. The method of claim 1, wherein the heating the substrate occurs within five minutes after the incorporating nitrogen.

3. The method of claim 2, wherein the substrate is annealed within two minutes after the nitrogen is incorporated.

4. The method of claim 3, wherein the substrate is annealed within one minute after the nitrogen is incorporated.

5. The method of claim 1, wherein a temperature ramp rate of the substrate in the anneal chamber is at least 60° C./s.

6. The method of claim 5, wherein the anneal chamber is a cold wall chamber.

7. The method of claim 5, wherein the substrate is heated to at least 800° C. in the anneal chamber.

8. The method of claim 1, wherein the substrate is heated to at least 800° C. in the anneal chamber.

9. The method of claim 1, further comprising exposing the gate dielectric layer to a gas mixture comprising nitrogen or oxygen gas during the annealing.

10. The method of claim 9, wherein a pressure in the anneal chamber is at least 50 Torr.

11. The method of claim 1, wherein a pressure in the anneal chamber is at least 50 Torr.

12. The method of claim 1, wherein the gate dielectric layer is annealed within five minutes after the nitrogen is incorporated, a temperature ramp rate of the substrate in the anneal chamber is at least 60° C./s and the anneal chamber comprises nitrogen while the dielectric layer is annealed.

13. The method of claim 1, wherein the nitrogen is incorporated by exposing the gate dielectric layer to a nitrogen plasma.

14. The method of claim 1, wherein the gate dielectric layer is silicon dioxide ($SiO_2$).

15. A method of processing a substrate, comprising:
    incorporating nitrogen (N) into a gate dielectric layer formed on a substrate while the substrate is located in a nitridation chamber of a system;
    transporting the substrate to an anneal chamber of the system without transporting the substrate out of the system; and
    annealing the gate dielectric layer by heating the substrate while in the anneal chamber to a temperature above a temperature of the substrate in the nitridation chamber, wherein the gate dielectric layer is exposed to at least 50% nitrogen gas by volume during the annealing.

16. The method of claim 15, wherein the substrate is annealed within one minute after the nitrogen is incorporated and a pressure in the anneal chamber is at least 50 Torr.

* * * * *

UNITED STATES PATENT AND TRADEMARK OFFICE
CERTIFICATE OF CORRECTION

PATENT NO. : 7,122,454 B2
APPLICATION NO. : 10/461143
DATED : October 17, 2006
INVENTOR(S) : Olsen It is certified that error appears in the above-identified patent and that said Letters Patent is hereby corrected as shown below:

Column 2, Line 63: Delete "The"

Column 4, Line 14: Insert a space between ""O"" and "rings"

Signed and Sealed this

Twentieth Day of March, 2007

JON W. DUDAS
*Director of the United States Patent and Trademark Office*